United States Patent
Endo et al.

(10) Patent No.: US 9,543,484 B1
(45) Date of Patent: Jan. 10, 2017

(54) SEMICONDUCTOR LIGHT EMITTING DEVICE AND METHOD FOR MANUFACTURING SAME

(71) Applicant: Kabushiki Kaisha Toshiba, Minato-ku (JP)

(72) Inventors: Mitsuyoshi Endo, Yamato (JP); Shuji Itonaga, Yokohama (JP); Miyuki Shimojuku, Kawasaki (JP); Yukihiro Nomura, Fuchu (JP); Hideto Furuyama, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/065,146

(22) Filed: Mar. 9, 2016

(30) Foreign Application Priority Data

Sep. 11, 2015 (JP) .................................. 2015-179421

(51) Int. Cl.
| | |
|---|---|
| H01L 33/00 | (2010.01) |
| H01L 33/54 | (2010.01) |
| H01L 33/46 | (2010.01) |
| H01L 33/02 | (2010.01) |
| H01L 33/62 | (2010.01) |
| H01L 33/50 | (2010.01) |

(52) U.S. Cl.
CPC .......... *H01L 33/54* (2013.01); *H01L 33/0012* (2013.01); *H01L 33/02* (2013.01); *H01L 33/46* (2013.01); *H01L 33/502* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 8,916,901 B2 | 12/2014 | Kimura et al. | |
| 9,087,974 B2 | 7/2015 | Kimura et al. | |
| 2011/0297986 A1* | 12/2011 | Nishiuchi | H01L 33/0079 257/98 |

* cited by examiner

*Primary Examiner* — Dale E Page
*Assistant Examiner* — Quovaunda V Jefferson
(74) *Attorney, Agent, or Firm* — Oblon, McClelland, Maier & Neustadt, L.L.P.

(57) ABSTRACT

According to one embodiment, a semiconductor light-emitting device includes a semiconductor layer including a first semiconductor layer, a second semiconductor layer, a light emitting layer, a first surface, and a second surface, the light emitting layer provided between the first semiconductor layer and the second semiconductor layer, the second surface opposing the first surface; a p-side electrode; an n-side electrode; a p-side pillar; an n-side pillar; a first insulating layer; an optical layer; a second insulating layer; a first layer; a p-side interconnect; and an n-side interconnect. The first layer includes a first lower end portion and a second lower end portion.

20 Claims, 12 Drawing Sheets

SEMICONDUCTOR LIGHT EMITTING DEVICE AND METHOD FOR MANUFACTURING SAME

CROSS-REFERENCE TO RELATED APPLICATION

This application is based upon and claims the benefit of priority from Japanese Patent Application No. 2015-179421, filed on Sep. 11, 2015; the entire contents of which are incorporated herein by reference.

FIELD

Embodiments described herein relate generally to a semiconductor light emitting device and a method for manufacturing same.

BACKGROUND

A semiconductor light emitting device that has a chip size package structure has been proposed in which a fluorescer layer and multiple fluorescers are provided on one surface side of a semiconductor layer including a light emitting layer; and interconnect layers, external terminals and a resin layer are provided on one other surface (mounting surface) side.

Improvement of the optical characteristics may be problematic for the structure on the fluorescer layer side.

DETAILED DESCRIPTION

Figure 1:
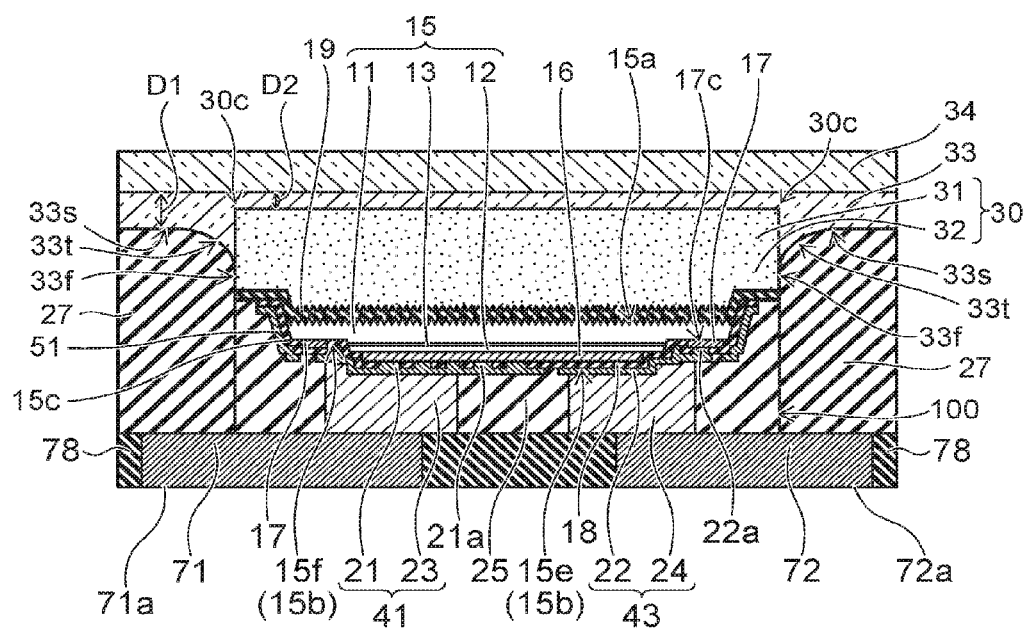
FIG. 1 is a schematic cross-sectional view of a semiconductor light emitting device of an embodiment.

According to one embodiment, a semiconductor light-emitting device includes: a semiconductor layer; a p-side electrode; an n-side electrode; a p-side pillar; an n-side pillar; a first insulating layer; an optical layer; a second insulating layer; a first layer; a p-side interconnect; and an n-side interconnect. The semiconductor layer includes a first semiconductor layer, a second semiconductor layer, a light emitting layer, a first surface, and a second surface. The light emitting layer is provided between the first semiconductor layer and the second semiconductor layer. The second surface opposes the first surface. The p-side electrode contacts the second semiconductor layer. The n-side electrode contacts the first semiconductor layer. The p-side pillar is provided on the second surface side. The p-side pillar contacts the p-side electrode. The n-side pillar is provided on the second surface side. The n-side pillar contacts the n-side electrode. The first insulating layer is provided on an outer side of a side surface of the semiconductor layer. The optical layer is provided on the first surface of the first semiconductor layer and on the first insulating layer. The second insulating layer is provided on an outer side of a side surface of the first insulating layer and on an outer side of a side surface of the optical layer. The first layer is provided on the second insulating layer and on the optical layer. The first layer contacts an upper surface, a side surface, and a corner of the optical layer. The first layer is light-transmissive. The first layer includes a first lower end portion contacting the side surface of the optical layer and the upper surface of the second insulating layer, and a second lower end portion separated from the optical layer and provided at a height lower than a height of the corner of the optical layer and not less than a height of the first lower end portion. The second lower end portion contacts the upper surface of the second insulating layer. The p-side interconnect contacts the p-side pillar and extends in a region overlapping the first insulating layer and the second insulating layer. The n-side interconnect is separated from the p-side interconnect. The n-side interconnect contacts the n-side pillar and extends in a region overlapping the first insulating layer and the second insulating layer.

Embodiments are described below with reference to the drawings. Note that in the drawings, the same components are denoted by the same reference numerals and signs.

FIG. 1 is a schematic cross-sectional view of a semiconductor light emitting device of an embodiment.

Figure 2A:
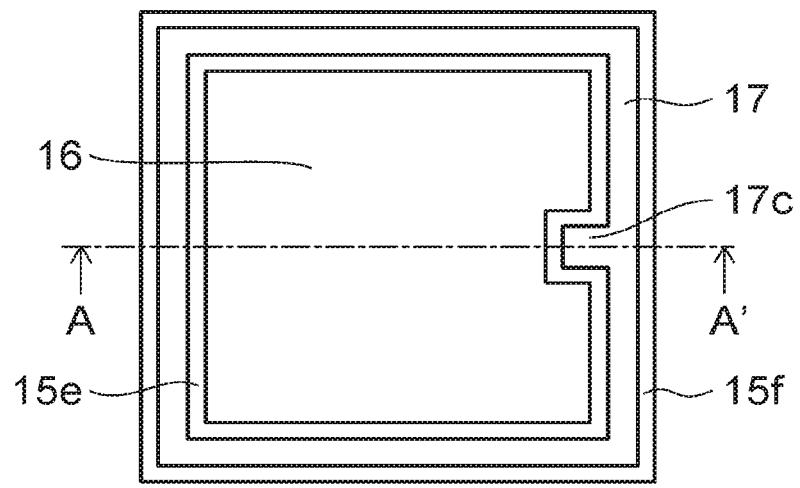
FIG. 2A is a schematic plan view showing an example of the planar layout of the semiconductor light emitting device of the embodiment.

FIG. 2A is a schematic plan view showing an example of the planar layout of a p-side electrode 16 and an n-side electrode 17 of the semiconductor light emitting device of the embodiment. FIG. 1 corresponds to an A-A' cross section of FIG. 2A. FIG. 2A corresponds to a drawing as viewed from a second surface 15b of a semiconductor layer 15 without interconnect units 41 and 43, a resin layer 25, an insulating film 18, and a reflective film 51 of FIG. 1.

Figure 2B:
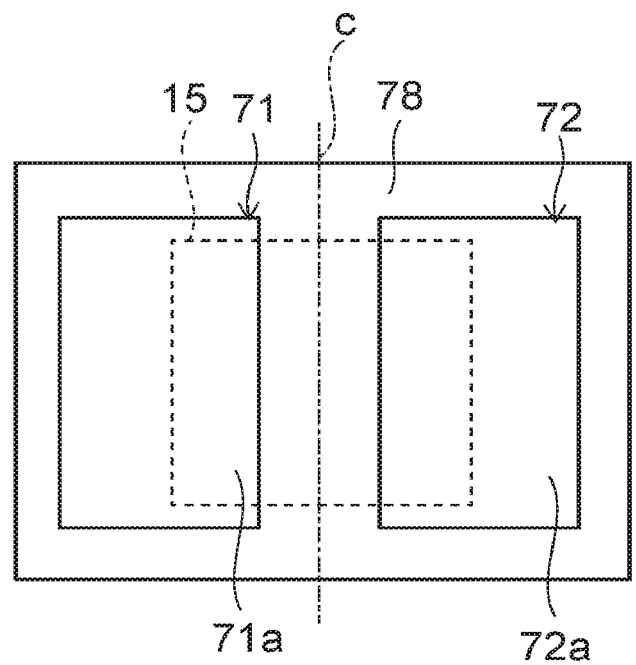
FIG. 2B is a schematic plan view showing an example of a mounting surface of the semiconductor light emitting device of the embodiment.

FIG. 2B is a schematic plan view showing an example of a mounting surface of the semiconductor light emitting device of the embodiment (the lower surface of the semiconductor light emitting device of FIG. 1).

The semiconductor light emitting device of the embodiment includes the semiconductor layer 15 that includes a light emitting layer 13. The semiconductor layer 15 has a first surface 15a, and the second surface 15b on the side opposite to the first surface 15a.

The second surface 15b of the semiconductor layer 15 includes a portion 15e (a light emitting region) that includes the light emitting layer 13, and a portion 15f (a non-light emitting region) that does not include the light emitting layer 13. The portion 15e that includes the light emitting layer 13 is the portion of the semiconductor layer 15 where the light emitting layer 13 is stacked. The portion 15f that does not include the light emitting layer 13 is the portion of the semiconductor layer 15 where the light emitting layer 13 is not stacked. The portion 15e that includes the light emitting layer 13 is the region of the stacked structure where the light emitted by the light emitting layer 13 is extractable to the outside.

On the second surface 15b, the p-side electrode 16 is provided as a first electrode on the portion 15e including the light emitting layer 13; and the n-side electrode 17 is provided as a second electrode on the portion 15f not including the light emitting layer.

In the example shown in FIG. 2A, the portion 15f that does not include the light emitting layer 13 surrounds the portion 15e including the light emitting layer 13; and the n-side electrode 17 surrounds the p-side electrode 16.

A current is supplied to the light emitting layer 13 via the p-side electrode 16 and the n-side electrode 17. Thereby, the light emitting layer 13 emits light. Then, the light that is radiated from the light emitting layer 13 is emitted outside the semiconductor light emitting device from the first surface 15a.

A support body 100 is provided on the second surface 15b of the semiconductor layer 15 as shown in FIG. 1. The light emitting element that includes the semiconductor layer 15, the p-side electrode 16, and the n-side electrode 17 is supported by the support body 100 provided on the second surface 15b.

A fluorescer layer 30 (an optical layer) that provides the desired optical characteristics to the light emitted by the semiconductor light emitting device is provided on the first surface 15a of the semiconductor layer 15. The fluorescer layer 30 is transmissive to the light radiated by the light emitting layer 13.

For example, an insulating layer 19 that is adhesive is provided between the fluorescer layer 30 and the semiconductor layer 15. The insulating layer 19 is transmissive. For example, the insulating layer 19 may not be provided. In such a case, the fluorescer layer 30 may contact the semiconductor layer 15.

The fluorescer layer 30 includes multiple fluorescers 31 that have particle configurations. The fluorescers 31 are excited by the light radiated by the light emitting layer 13 and radiate light of a wavelength different from that of the radiated light.

The multiple fluorescers 31 are formed as one body with a binder 32. The binder 32 is light-transmissive. Here, "light-transmissive" refers to being transmissive to light including the light emitted from the light radiated by the light emitting layer 13 and the light radiated by the fluorescers 31. "Transmitting" is not limited to the transmittance being 100% and includes the case where a portion of the light is absorbed.

The semiconductor layer 15 includes a first semiconductor layer 11, a second semiconductor layer 12, and the light emitting layer 13. The light emitting layer 13 is provided between the first semiconductor layer 11 and the second semiconductor layer 12. For example, the first semiconductor layer 11 and the second semiconductor layer 12 include gallium nitride.

The first semiconductor layer 11 is, for example, an n-type semiconductor and includes a foundation buffer layer and an n-type GaN layer. The second semiconductor layer 12 is, for example, a p-type semiconductor and includes a p-type GaN layer. The light emitting layer 13 includes a material that emits blue light, violet light, bluish-violet light, ultraviolet light, etc. The light emission peak wavelength of the light emitting layer 13 is, for example, 430 to 470 nm.

The second surface 15b of the semiconductor layer 15 is patterned into an uneven configuration. The protrusion of the second surface 15b of the semiconductor layer 15 is the portion 15e that includes the light emitting layer 13; and the recess of the second surface 15b of the semiconductor layer 15 is the portion 15f that does not include the light emitting layer 13. The surface of the portion 15e including the light emitting layer 13 is the surface of the second semiconductor layer 12; and the p-side electrode 16 is provided on the surface of the second semiconductor layer 12. The p-side electrode 16 contacts the second semiconductor layer 12. The surface of the portion 15f not including the light emitting layer 13 is the surface of the first semiconductor layer 11; and the n-side electrode 17 is provided on the surface of the first semiconductor layer 11. The n-side electrode 17 contacts the first semiconductor layer 11.

At the second surface 15b of the semiconductor layer 15, the surface area of the portion 15e including the light emitting layer 13 is greater than the surface area of the portion 15f not including the light emitting layer 13. Also, the surface area of the p-side electrode 16 provided on the surface of the portion 15e including the light emitting layer 13 is greater than the surface area of the n-side electrode 17 provided on the surface of the portion 15f not including the light emitting layer 13. Thereby, a wide light emitting surface is obtained; and the light output can be high.

As shown in FIG. 2A, the n-side electrode 17 includes, for example, four straight portions; and a contact portion 17c that protrudes in the width direction of the straight portion is provided in one straight portion of the four straight portions. A via 22a of a first n-side interconnect layer 22 is connected to the surface of the contact portion 17c as shown in FIG. 1.

As shown in FIG. 1, the second surface 15b of the semiconductor layer 15, the p-side electrode 16, and the n-side electrode 17 are covered with the insulating film 18. The insulating film 18 is, for example, an inorganic insulating film such as a silicon oxide film, etc. The insulating film 18 is provided also on the side surface of the light emitting layer 13 and the side surface of the second semiconductor layer 12 and covers the side surface of the light emitting layer 13 and the side surface of the semiconductor layer 12.

The insulating film 18 is provided also on a side surface 15c of the semiconductor layer 15 (the side surface of the first semiconductor layer 11) that is continuous from the first surface 15a; and the insulating film 18 covers the side surface 15c.

The insulating film 18 is further provided in the chip outer circumferential portion adjacent to the side surface 15c of the semiconductor layer 15. The insulating film 18 that is provided on the chip outer circumferential portion extends in a direction away from the side surface 15c on the first surface 15a.

A first p-side interconnect layer 21 as a first interconnect layer and the first n-side interconnect layer 22 as a second interconnect layer are provided to be separated from each other on the insulating film 18 on the second surface 15b. Multiple first openings that communicate with the p-side electrode 16 and a second opening that communicates with the contact portion 17c of the n-side electrode 17 are made in the insulating film 18. The first openings may be one large opening.

The first p-side interconnect layer 21 is provided in the interiors of the first openings and on the insulating film 18. The first p-side interconnect layer 21 is electrically connected to the p-side electrode 16 by vias 21a provided inside the first openings.

The first n-side interconnect layer 22 is provided in the interior of the second opening and on the insulating film 18. The first n-side interconnect layer 22 is electrically connected to the n-side electrode 17 by the via 22a provided inside the second opening.

The first p-side interconnect layer 21 and the first n-side interconnect layer 22 spread over the insulating film 18 and occupy the greater part of the region of the second surface 15b. The first p-side interconnect layer 21 is connected to the p-side electrode 16 by the multiple vias 21a.

A reflective film 51 (a metal film) covers the side surface 15c of the semiconductor layer 15 with the insulating film 18 interposed. The reflective film 51 does not contact the side surface 15c and is separated from the semiconductor layer 15. The reflective film 51 is reflective to the light radiated by the light emitting layer 13 and the light radiated by the fluorescers 31.

The reflective film 51, the first p-side interconnect layer 21, and the first n-side interconnect layer 22 include, for example, a copper film formed simultaneously on a common metal film by plating. For example, the reflective film 51 is separated from the first p-side interconnect layer 21 and the first n-side interconnect layer 22. For example, the reflective film 51 may be provided as one body with at least one of the first p-side interconnect layer 21 or the first n-side interconnect layer 22.

The reflective film 51 may be formed of a metal film at the chip outer circumferential portion adjacent to the side surface 15c of the semiconductor layer 15 without forming the plating film (the copper film) on the metal film. The reflective film 51 has a high reflectance for the light radiated by the light emitting layer 13 and the light radiated by the fluorescers 31 by including at least an aluminum film.

Because the foundation metal film (the aluminum film) remains also under the first p-side interconnect layer 21 and the first n-side interconnect layer 22, the aluminum film is formed to spread in the region of the greater part of the second surface 15b. Thereby, the amount of the light toward the fluorescer layer 30 side can be increased.

A p-side pillar 23 is provided as a first metal pillar on the surface of the first p-side interconnect layer 21 on the side opposite to the semiconductor layer 15. The first p-side interconnect unit 41 is formed of the first p-side interconnect layer 21 and the p-side pillar 23. The p-side pillar 23 is electrically connected to the p-side electrode 16.

An n-side pillar 24 is provided as a second metal pillar on the surface of the first n-side interconnect layer 22 on the side opposite to the semiconductor layer 15. The first n-side interconnect unit 43 is formed of the first n-side interconnect layer 22 and the n-side pillar 24. The n-side pillar 24 is electrically connected to the n-side electrode 17.

The resin layer 25 (a first insulating layer) is provided between the first p-side interconnect unit 41 and the first n-side interconnect unit 43. The resin layer 25 is provided between the p-side pillar 23 and the n-side pillar 24 to contact the side surface of the p-side pillar 23 and the side surface of the n-side pillar 24. In other words, the p-side pillar 23 is separated from the n-side pillar 24 with the resin layer 25 interposed. The resin layer 25 is filled between the p-side pillar 23 and the n-side pillar 24.

The resin layer 25 is provided also between the first p-side interconnect layer 21 and the first n-side interconnect layer 22, between the first p-side interconnect layer 21 and the reflective film 51, and between the first n-side interconnect layer 22 and the reflective film 51.

The resin layer 25 is provided on the side surface of the p-side electrode 16 and the side surface of the n-side electrode 17. The resin layer 25 is provided on the side surface 15c of the semiconductor layer 15. The insulating film 18 is provided between the resin layer 25, the side surface of the p-side electrode 16, the side surface of the n-side electrode 17, and the side surface 15c. For example, the insulating film 18 and the reflective film 51 may be provided between the resin layer 25, the side surface of the p-side electrode 16, the side surface of the n-side electrode 17, and the side surface 15c.

The resin layer 25 is provided at the periphery of the p-side pillar 23 and the periphery of the n-side pillar 24 and covers the side surface of the p-side pillar 23 and the side surface of the n-side pillar 24. The resin layer 25 is provided also in the chip outer circumferential portion adjacent to the side surface 15c of the semiconductor layer 15 and covers the reflective film 51.

The fluorescer layer 30 is provided on the resin layer 25 provided in the chip outer circumferential portion. In other words, the fluorescer layer 30 is provided on the semiconductor layer 15 and on the resin layer 25 and is separated, with the semiconductor layer 15 interposed, from the p-side electrode 16 and the n-side electrode 17.

The lower surface of the p-side pillar 23 and the lower surface of the n-side pillar 24 are arranged to be separated from each other in the same plane as the lower surface of the resin layer 25. The spacing between the p-side pillar 23 and the n-side pillar 24 is wider than the spacing between the first n-side interconnect layer 22 and the first p-side interconnect layer 21 on the insulating film 18.

The spacing between the first p-side interconnect layer 21 and the first n-side interconnect layer 22 can be set to be narrow to the limit of the process. Therefore, the surface area of the first p-side interconnect layer 21 and the contact surface area between the first p-side interconnect layer 21 and the p-side pillar 23 can be enlarged. Thereby, the dissipation of the heat of the light emitting layer 13 can be promoted.

The surface area of the first p-side interconnect layer 21 contacting the p-side electrode 16 by the multiple vias 21a is greater than the surface area of the first n-side interconnect layer 22 contacting the n-side electrode 17 by the via 22a. Thereby, the distribution of the current flowing in the light emitting layer 13 can be uniform.

The surface area of the first n-side interconnect layer 22 spreading over the insulating film 18 can be greater than the surface area of the n-side electrode 17. Also, the surface area of the lower surface of the n-side pillar 24 provided on the first n-side interconnect layer 22 can be wider than the n-side electrode 17. Thereby, it is possible to set the surface area of the n-side electrode 17 to be small while ensuring a surface area of the lower surface of the n-side pillar 24 that is sufficient for forming an n-side interconnect 72 described below. In other words, it is possible to improve the light output by reducing the surface area of the portion 15f of the semiconductor layer 15 not including the light emitting layer 13 and by increasing the surface area of the portion 15e including the light emitting layer 13.

The first semiconductor layer 11 is electrically connected to the n-side pillar 24 via the n-side electrode 17 and the first n-side interconnect layer 22. The second semiconductor layer 12 is electrically connected to the p-side pillar 23 via the p-side electrode 16 and the first p-side interconnect layer 21.

The thickness of the p-side pillar 23 is thicker than the thickness of the first p-side interconnect layer 21. The thickness of the n-side pillar 24 is thicker than the thickness of the first n-side interconnect layer 22. The thicknesses of the p-side pillar 23, the n-side pillar 24, and the resin layer 25 are thicker than the semiconductor layer 15. Herein, the "thickness" refers to the thickness in a direction from the semiconductor layer 15 toward the p-side pillar 23 and the n-side pillar 24.

The aspect ratios (the ratios of the thicknesses to the planar sizes) of the metal pillars 23 and 24 may be equal to, greater than, or less than 1. In other words, the metal pillars 23 and 24 may be thicker or thinner than their planar sizes.

The thickness of the support body 100 including the first p-side interconnect layer 21, the first n-side interconnect layer 22, the p-side pillar 23, the n-side pillar 24, and the resin layer 25 is thicker than the thickness of the light emitting element (the LED chip) including the semiconductor layer 15, the p-side electrode 16, and the n-side electrode 17.

An insulating member 27 (a second insulating layer) is provided in the region outside the chip further outward than the side surface of the resin layer 25 surrounding the p-side pillar 23 and the n-side pillar 24. The insulating member 27 is provided on the outer side of the side surface of the resin layer 25 and the outer side of the side surface of the fluorescer layer 30. The insulating member 27 covers the side surface of the resin layer 25 and the side surface of the fluorescer layer 30. The insulating member 27 reflects the light emitted from the light emitting layer 13 and the fluorescer layer 30.

The insulating member 27 contacts the side surface of the resin layer 25 and the side surface of the fluorescer layer 30. The upper surface of the insulating member 27 is provided at a height that is more proximal to the semiconductor layer 15 than is the height of the upper surface of the fluorescer layer 30. The upper surface of the insulating member 27 is provided at a height that is between the height of the upper surface of the fluorescer layer 30 and the height of the upper surface of the resin layer 25. Herein, the "height" refers to a position in a direction (a first direction) from the semiconductor layer 15 toward the fluorescer layer 30; and this is similar to the heights described below.

A portion of the upper surface of the insulating member 27 is tilted with respect to the side surface of the fluorescer layer 30 and has, for example, a curved surface having a protruding configuration. The upper surface of the insulating member 27 approaches the height of the upper surface of the fluorescer layer 30 away from the side surface of the fluorescer layer 30.

The height of the portion of the upper surface of the insulating member 27 contacting the fluorescer layer 30 is lower than the height of the portion of the upper surface of the insulating member 27 separated from the fluorescer layer 30. Therefore, the fluorescer layer 30 includes a stepped portion provided between the upper surface of the fluorescer layer 30 and the upper surface of the insulating member 27. The insulating member 27 is separated from a corner 30c provided between the upper surface and side surface of the fluorescer layer 30.

A transparent layer 33 (a first layer) that is light-transmissive is provided on the fluorescer layer 30, on the side surface of the fluorescer layer 30 and on the insulating member 27. The transparent layer 33 contacts the upper surface, side surface, and corner 30c of the fluorescer layer 30.

For example, the transparent layer 33 includes a first lower end portion 33f and a second lower end portion 33s. The first lower end portion 33f and the second lower end portion 33s contact the upper surface of the insulating member 27. The first lower end portion 33f contacts the side surface of the fluorescer layer 30; and the second lower end portion 33s is separated from the fluorescer layer 30.

In the first direction, the first lower end portion 33f is provided at a height that is between the height of the corner 30c and the height of the upper surface of the resin layer 25. The second lower end portion 33s is provided at a height that is lower than the height of the corner 30c and not less than the height of the first lower end portion 33f. In the first direction, a distance D1 from the second lower end portion 33s to the upper surface of the transparent layer 33 is longer than a distance D2 from the upper surface of the fluorescer layer 30 to the upper surface of the transparent layer 33.

The transparent layer 33 includes a tilted portion 33t that is tilted with respect to the side surface of the fluorescer layer 30. The tilted portion 33t is provided to be continuous from the first lower end portion 33f to the second lower end portion 33s. For example, the tilted portion 33t has a curved surface that has a recessed configuration from the first lower end portion 33f to the second lower end portion 33s. In other words, the first lower end portion 33f protrudes further into the insulating member 27 than does the second lower end portion 33s.

For example, the height of the first lower end portion 33f, the height of the second lower end portion 33s, and the configuration of the tilted portion 33t may be provided uniformly and are arbitrary.

The transparent layer 33 is light-transmissive. The refractive index of the transparent layer 33 is, for example, equal to or less than the refractive index of the fluorescer layer 30 and is 1 or more.

Thereby, reflections occurring at the surface of the fluorescer layer 30 due to the refractive index difference between the refractive index of the fluorescer layer 30 and the outside (air having a refractive index of 1) can be suppressed; and the loss due to the light that is reflected by the fluorescer layer 30 surface, travels toward the inner side of the fluorescer layer 30, contacts the fluorescers 31, and is partially absorbed can be reduced. In other words, it is possible for the light extraction efficiency to be higher than direct light emission from the fluorescer layer 30 by enlarging the light emitting surface area by causing the light traveling from the fluorescer layer 30 toward the outside to proceed into the transparent layer 33 and emitting the light from the transparent layer surface and side surface.

For example, a substrate 34 (a second layer) that is light-transmissive is provided on the transparent layer 33. The substrate 34 includes, for example, sapphire. For example, the substrate 34 may include glass and may include soda glass, borosilicate glass, quartz glass, etc. Thereby, the rigidity of the entire semiconductor light emitting device is increased; and damages due to temperature fluctuation, external stress, etc., can be suppressed. In other words, the reliability of the semiconductor light emitting device can be increased.

It goes without saying that a configuration may be added in which the surface reflections are reduced by performing unevenness processing, low-refractive index transparent layer coating, etc., of the surface of the substrate 34.

For example, a not-shown transparent resin may be stacked on the substrate 34. The refractive index of the transparent resin is equal to or less than the refractive index of the substrate 34 and is 1 or more. Thereby, it is possible to increase the light extraction efficiency further. The transparent resin may be a stack of different materials; and the number of stacks of the transparent resin is arbitrary.

A p-side interconnect 71 and the n-side interconnect 72 are provided on the second surface 15b side of the semiconductor layer 15. The p-side interconnect 71 contacts the p-side pillar 23; the n-side interconnect 72 contacts the n-side pillar 24; and the p-side interconnect 71 and the n-side interconnect 72 extend across the boundary between the resin layer 25 and the insulating member 27 to regions overlapping the insulating member 27 (regions outside the semiconductor layer 15).

In other words, the p-side interconnect 71 is provided as one body under the resin layer 25, under the insulating member 27, and under the p-side pillar 23. The n-side interconnect 72 is provided as one body under the resin layer 25, under the insulating member 27, and under the n-side pillar 24. Here, "overlapping" refers to being provided so that configurations overlap as viewed from the first direction; and it is arbitrary whether or not the configurations are separated or are in contact.

The p-side interconnect 71 is provided on the end portion (the surface) of the p-side pillar 23 on the side opposite to the surface contacting the first p-side interconnect layer 21. The portion of the p-side interconnect 71 extending into the region outside the chip is supported by the insulating member 27.

The n-side interconnect 72 is provided on the end portion (the surface) of the n-side pillar 24 on the side opposite to the surface contacting the first n-side interconnect layer 22. The portion of the n-side interconnect 72 extending into the region outside the chip is supported by the insulating member 27.

An insulating film 78 is provided on the side surface of the p-side interconnect 71 and the side surface of the n-side interconnect 72. The insulating film 78 is, for example, an inorganic film such as a silicon oxide film, etc., or an organic film such as an epoxy resin, a polyimide resin, etc.

The insulating film 78 contacts the side surface of the p-side interconnect 71 and the side surface of the n-side interconnect 72 and is filled between the p-side interconnect 71 and the n-side interconnect 72.

The insulating film 78 strengthens the mechanical strength of the p-side interconnect 71 and the n-side interconnect 72. Also, the insulating film 78 functions as a solder resist that prevents spreading of the solder by wetting when mounting.

The lower surface of the p-side interconnect 71 is exposed from the insulating film 78 and functions as a p-side mounting surface 71a (a p-side external terminal) that is connectable to an external circuit such as a mounting substrate, etc. The lower surface of the n-side interconnect 72 is exposed from the insulating film 78 and functions as an n-side mounting surface 72a (an n-side external terminal) that is connectable to an external circuit such as a mounting substrate, etc. For example, the p-side mounting surface 71a and the n-side mounting surface 72a are bonded to a land pattern of a mounting substrate via solder or a conductive bonding agent.

Here, it is desirable for the p-side mounting surface 71a and the n-side mounting surface 72a to protrude from the surface of the insulating film 78. Thereby, the configuration of the solder when mounting is stabilized; and the reliability of the mounting can be increased.

FIG. 2B shows an example of the planar layout of the p-side mounting surface 71a and the n-side mounting surface 72a. The p-side mounting surface 71a and the n-side mounting surface 72a of FIG. 2B are arranged symmetrically with respect to a center line c that divides the planar region of the semiconductor layer 15 into, for example, two equal parts; and the surface area of the p-side mounting surface 71a is about the same as the surface area of the n-side mounting surface 72a. The configuration may be asymmetric to increase the share of the thermal conduction characteristics and the stress relief of one of the mounting surfaces.

The spacing between the p-side mounting surface 71a and the n-side mounting surface 72a is set to a spacing such that the solder does not bridge between the p-side mounting surface 71a and the n-side mounting surface 72a when mounting and is, for example, 200 µm or more. Thereby, the reliability of the mounting can be increased.

The semiconductor layer 15 is formed on the substrate by epitaxial growth. The substrate is removed; and the semiconductor layer 15 does not include the substrate on the first surface 15a. The semiconductor light emitting device is thinner due to the removal of the substrate.

Here, in the case where there is a substrate of sapphire, etc., on the first surface 15a, light leaks to the outside from the side surface of the substrate without the light being incident on the fluorescer layer 30. In other words, the light of the light emitting layer 13 that has a strong tint leaks from the side surface of the substrate which may cause color breakup and uneven color such as a phenomenon in which a ring of blue light is viewed at the outer edge side when the fluorescer layer 30 is viewed from the upper surface, etc.

Conversely, according to the embodiment, there is no substrate between the first surface 15a and the fluorescer layer 30; therefore, color breakup and uneven color due to the light of the light emitting layer 13 that has a strong tint leaking from the substrate side surface can be prevented.

Further, a micro unevenness can be formed in the first surface 15a of the semiconductor layer 15 by removing the substrate. For example, the micro unevenness is formed by performing wet etching of the first surface 15a using an alkaline solution. Thereby, the total internal reflection component at the first surface 15a is reduced; and the light extraction efficiency can be increased.

After the substrate is removed, for example, the fluorescer layer 30 is formed on the first surface 15a with the insulating layer 19 interposed. The insulating layer 19 functions as an adhesion layer that increases the adhesion between the semiconductor layer 15 and the fluorescer layer 30 and is, for example, a silicon oxide film or a silicon nitride film.

The fluorescer layer 30 has a structure in which the multiple fluorescers 31 having the particle configurations are dispersed in the binder 32. The binder 32 may include, for example, a silicone resin.

The fluorescer layer 30 is formed also on the chip outer circumferential portion at the periphery of the side surface 15c of the semiconductor layer 15. Accordingly, the planar size of the fluorescer layer 30 is larger than the planar size of the semiconductor layer 15. At the chip outer circumferential portion, the fluorescer layer 30 is provided on the insulating film 18 (e.g., the silicon oxide film). The "planar size" described above refers to the planar surface area when viewing the direction of the support body 100 from the semiconductor layer 15.

The semiconductor layer 15 is supported, with the support body 100 interposed, by the compound body of the p-side interconnect 71, the n-side interconnect 72, and the insulating film 78.

For example, copper, gold, nickel, silver, etc., may be used as the materials of the first p-side interconnect unit 41, the first n-side interconnect unit 43, the p-side interconnect 71, and the n-side interconnect 72 (the interconnect units). Among these, good thermal conductivity, high migration resistance, and adhesion with insulating materials can be improved when copper is used.

The resin layer 25 reinforces the p-side pillar 23 and the n-side pillar 24. It is desirable for the resin layer 25 to have a coefficient of thermal expansion near to or the same as that of the mounting substrate. Examples of such a resin layer 25 include, for example, a resin including mainly an epoxy resin, a resin including mainly a silicone resin, and a resin including mainly a fluorocarbon resin.

The resin that is the base of the resin layer 25 includes a light-shielding material (a light absorbing agent, a light reflecting agent, a light scattering agent, etc.); and the resin layer 25 is light-shielding to the light emitted by the light emitting layer 13. Thereby, light leakage from the side surface of the support body 100 and the mounting surface side can be suppressed.

According to the embodiment, the reflective film 51 is provided on the side surface 15c of the semiconductor layer 15 with the insulating film 18 interposed. The light that travels from the light emitting layer 13 toward the side surface 15c of the semiconductor layer 15 is reflected by the reflective film 51 and does not leak to the outside. Therefore, color breakup and uneven color due to the light leakage from the side surface side of the semiconductor light emitting device can be prevented in addition to the feature of having no substrate on the first surface 15a.

For example, the reflective film 51 is separated from the first p-side interconnect unit 41 and the first n-side interconnect unit 43. In such a case, the stress that is applied to the p-side pillar 23 and the n-side pillar 24 when mounting is not transmitted to the reflective film 51. Accordingly, peeling of the reflective film 51 can be suppressed. Also, the stress that is applied to the side surface 15c side of the semiconductor layer 15 can be suppressed.

For example, the reflective film 51 may be provided as one body with the p-side interconnect unit 41 and the n-side interconnect unit 43. Thereby, a heat dissipation path is formed; and the heat dissipation of the semiconductor layer 15 improves. For example, a portion of the reflective film 51 is formed as one body with the p-side interconnect unit 41; the remainder of the reflective film 51 is formed as one body with the n-side interconnect unit 43; and these portions are insulated from each other.

For example, the reflective film 51 may be provided as one body with either one of the p-side interconnect unit 41 or the n-side interconnect unit 43. In such a case, the reflective film 51 may be formed to cover the entire circumference of the side surface of the semiconductor layer 15 in a ring configuration (an O-shape). Thereby, it is possible to suppress the light leakage further.

For example, the reflective film 51 may be separated from the p-side interconnect unit 41 and the n-side interconnect unit 43. In such a case, the reflective film 51 may be formed to cover the entire circumference of the side surface of the semiconductor layer 15 in a ring configuration (an O-shape). Thereby, it is possible to suppress the light leakage further.

The side surface 15c of the semiconductor layer 15 where the reflective film 51 is provided is tilted with respect to the first surface 15a (the flat portion of the first surface 15a). Also, the side surface 15c is tilted with respect to the second surface 15b. Accordingly, the reflective surface that is provided on the side surface is tilted with respect to the first surface 15a and the second surface 15b. The extension line of the side surface 15c is tilted to form an obtuse angle with the interface between the fluorescer layer 30 and the insulating layer 19.

The insulating film 18 that is provided between the reflective film 51 and the side surface 15c of the semiconductor layer 15 prevents the diffusion of the metal included in the reflective film 51 into the semiconductor layer 15. Thereby, for example, metal contamination of the GaN of the semiconductor layer 15 can be prevented; and degradation of the semiconductor layer 15 can be prevented.

The insulating film 18 that is provided between the reflective film 51 and the fluorescer layer 30 and between the resin layer 25 and the fluorescer layer 30 increases the adhesion between the reflective film 51 and the fluorescer layer 30 and the adhesion between the resin layer 25 and the fluorescer layer 30.

The insulating film 18 is, for example, an inorganic insulating film such as a silicon oxide film, a silicon nitride film, etc. In other words, the first surface 15a and the second surface 15b of the semiconductor layer 15, the side surface 15c of the first semiconductor layer 11, the side surface of the second semiconductor layer 12, and the side surface of the light emitting layer 13 are covered with an inorganic insulating film. The inorganic insulating film surrounds the semiconductor layer and shields the semiconductor layer 15 from metals, moisture, etc.

For example, in the thermal cycle when mounting the semiconductor light emitting device, the p-side mounting surface 71a and the n-side mounting surface 72a are bonded to the lands of the mounting substrate; and stress caused by the solder, etc., is applied to the semiconductor layer 15. The p-side interconnect 71, the n-side interconnect 72, and the insulating film 78 can absorb and relax the stress recited above by forming the p-side interconnect 71, the n-side interconnect 72, and the insulating film 78 to have appropriate thicknesses (heights). In particular, the stress relieving effect can be increased by using the insulating film 78 that is more flexible than the semiconductor layer 15 as a portion of the support body on the mounting surface side.

The interconnect units 41 and 43 and the interconnects 71 and 72 include, for example, copper which has a high thermal conductivity as major components; and high thermal conductivity bodies are spread over a wide surface area in regions overlapping the light emitting layer 13. The heat that is generated by the light emitting layer 13 is dissipated to the mounting substrate by a short path formed below the chip via the interconnect units 41 and 43 and the interconnects 71 and 72.

According to the embodiment, the p-side mounting surface 71a is extended to the region outside the chip as well. Accordingly, the planar size of the solder bonded to the p-side mounting surface 71a can be large; and the heat dissipation to the mounting substrate via the solder can be improved.

The light that is radiated from the light emitting layer 13 on the first surface 15a is incident on the fluorescer layer 30; a portion of the light excites the fluorescers 31; and, for example, white light is obtained as a mixed light of the light of the light emitting layer 13 and the light of the fluorescers 31.

The light that is radiated from the light emitting layer 13 on the mounting surface side is reflected by the p-side electrode 16 and the n-side electrode 17 toward the fluorescer layer 30 side above the p-side electrode 16 and the n-side electrode 17.

The portion of the insulating member 27 proximal to the side surface of the fluorescer layer 30 and the portion of the insulating member 27 proximal to the upper surface of the transparent layer 33 are reflective to the light radiated by the light emitting layer 13 and the light radiated by the fluorescers 31. Accordingly, the light radiated from the semiconductor layer 15 and the light scattered by the fluorescer layer 30 toward the insulating member 27 side can be reflected by the insulating member 27. The light extraction efficiency to the outside via the transparent layer 33 can be increased by preventing the absorption loss of the light of by the insulating member 27.

In addition to the description recited above, according to the embodiment, the transparent layer 33 contacts the upper surface, the corner 30c, and the side surface of the fluorescer layer 30. Thereby, the light that travels via the corner 30c vicinity of the fluorescer layer 30 and again enters toward the semiconductor layer 15 side by being reflected by the insulating member 27 can be suppressed. In other words, the light that travels via the upper surface vicinity of the fluorescer layer 30 is easily radiated to the outside. Therefore, the light extraction efficiency to the outside can be increased. In other words, it is possible to provide a semiconductor light emitting device having excellent optical characteristics.

The transparent layer 33 includes the first lower end portion 33f and the second lower end portion 33s. The second lower end portion 33s is provided at a height that is lower than the height of the corner 30c and not less than the height of the first lower end portion 33f.

For example, the first lower end portion 33f is provided in the same plane as the height of the second lower end portion 33s. In such a case, similarly to recited above, the light that travels via the upper surface vicinity of the fluorescer layer 30 is easily radiated to the outside. Therefore, the light extraction efficiency to the outside can be increased.

Figure 11A:
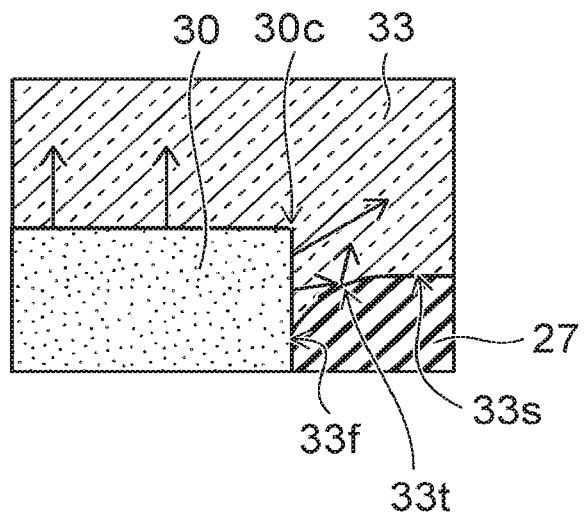
FIG. 11A and FIG. 11B are enlarged schematic cross-sectional views of a part of the semiconductor light emitting device of the embodiment.

The transparent layer 33 includes the tilted portion 33t that is tilted with respect to the side surface of the fluorescer layer 30. The tilted portion 33t is provided to be continuous from the first lower end portion 33f to the second lower end portion 33s. In such a case, the upper surface of the insulating member 27 approaches the height of the corner 30c of the fluorescer layer 30 away from the side surface of the fluorescer layer 30. Thereby, as shown in FIG. 11A, the light that travels via the tilted portion 33t is easily reflected in the upper surface direction of the fluorescer layer 30. Therefore, compared to the case where the transparent layer 33 is not tilted with respect to the side surface of the fluorescer layer 30, the light extraction efficiency to the outside can be increased. In other words, it is possible to provide a semiconductor light emitting device having excellent optical characteristics.

The tilted portion 33t has a curved surface. Thereby, the direction in which the light is reflected upward can be dispersed; and it is possible to provide a semiconductor light emitting device having excellent optical characteristics.

Figure 11B:
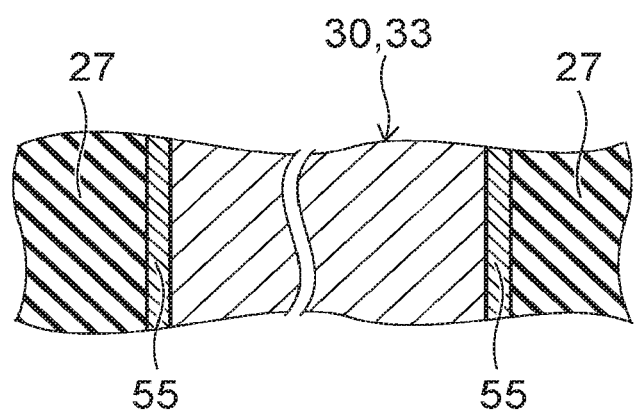

Also, as shown in FIG. 11B, similar effects can be obtained by providing a reflective layer 55 that is reflective on the surface of the portion of the insulating member 27 proximal to the side surface of the optical layer (the fluorescer layer 30).

For example, the insulating member 27 is a resin layer that has a reflectance to the light radiated by the light emitting layer 13 and the light radiated by the fluorescers 31 that is 50% or more.

In addition to the description recited above, according to the embodiment, for example, similarly to the resin layer 25, a material that is more flexible than the semiconductor layer 15 may be used as the insulating member 27. Therefore, it is possible to increase the stress relieving effect by using the insulating member 27 as a portion of the support body on the mounting surface side.

The fluorescer layer 30 is formed on the first surface 15a of the semiconductor layer 15 by a wafer level process; and the planar size of the fluorescer layer 30 is substantially the same as the planar size of the semiconductor layer 15 and slightly larger than the planar size of the semiconductor layer 15.

The fluorescer layer 30 is not formed to extend around to the side surface of the semiconductor layer 15 and the mounting surface side. In other words, the fluorescer layer 30 is not formed unnecessarily on the chip side surface side and the mounting surface side where the light is not extracted to the outside; and the cost is reduced.

For a general flip chip mount, a fluorescer layer is formed to cover the entire chip after the LED chip is mounted to the mounting substrate with bumps, etc., interposed. Or, a resin is under-filled between the bumps.

Conversely, according to the semiconductor light emitting device of the embodiment, the insulating film 78 that is different from the fluorescer layer 30 is provided at the periphery of the p-side interconnect 71 and the periphery of the n-side interconnect 72 in a state prior to the mounting shown in FIG. 1. Thereby, characteristics suited to stress relief can be provided to the mounting surface side. Because the insulating film 78 is provided on the mounting surface side, the under-fill after the mounting is unnecessary.

Optical layers designed with priority on light extraction efficiency, color conversion efficiency, light distribution characteristics, etc., are provided on the first surface 15a of the semiconductor layer 15; and layers that have priority on stress relief when mounting and characteristics of the support body used instead of the substrate are provided on the mounting surface side. For example, the insulating film 78 has a structure in which a filler such as silica particles or the like is filled at high density into the resin used as the base; and the insulating film 78 is adjusted to have the appropriate hardness as the support body.

According to the embodiment described above, an inexpensive chip size device can be realized by collectively forming the semiconductor layer 15, the electrodes 16 and 17, the interconnect layers 21 and 22, and the optical layer at the wafer level; and the heat dissipation can be improved by extending the external terminals (the mounting surfaces) 71a and 72a into the region outside the chip. Accordingly, an inexpensive semiconductor light emitting device having high reliability can be provided.

In addition to the description recited above, according to the embodiment, the insulating member 27 may include, for example, a material that is different from the resin layer 25. Here, "different material" includes the case where the same multiple chemical elements have different composition ratios. In such a case, for example, the insulating member 27 is provided as a separate body from the resin layer 25 and has an interface between the insulating member 27 and the resin layer 25.

The resin layer 25 includes a material that has stress relief superior to that of the insulating member 27 and includes, for example, a stress reliever (a rubber-based material, etc.). Thereby, the resin layer 25 can absorb the stress due to temperature fluctuation, etc., as a structure body, can support and reinforce the pillars 23 and 24, and can suppress the damage or degradation of the semiconductor layer 15 due to the thermal stress due to the temperature fluctuation and the stress due to the external force.

The resin layer 25 may include a material that absorbs the radiated light and includes, for example, carbon black which is carbon fine particles. Thereby, it is possible to suppress the light irradiation degradation of the resin layer 25 by suppressing light irradiation to the interior of the resin layer 25 by intense light from the light emitting layer 13 being absorbed at the surface vicinity of the resin layer 25.

Conversely, the insulating member 27 includes a material that is light-reflective; and the lower light extraction efficiency as a light emitting device is suppressed by reflecting the light emitted by the light emitting layer 13 and the light emitted by the fluorescers 31. For the insulating member 27, a limited amount of additives can be added to the material having low light absorption to prevent the absorption loss of the light; and it is not always possible to use a material configuration directed to stress relief as in the resin layer 25.

In other words, in the case where an insulating film of the same material is formed as one body as the resin layer 25 and the insulating member 27, there is a possibility that the suppression of the stress relief on the mounting surface side when mounting and the suppression of the absorption loss on the side surface side of the fluorescer layer 30 cannot be performed simultaneously.

Conversely, according to the embodiment, the resin layer 25 and the insulating member 27 of mutually-different materials are provided. Thereby, the improvement of the stress relieving effect on the mounting surface side and the suppression of the absorption loss on the side surface side of the fluorescer layer 30 can be performed simultaneously. In other words, it is possible to provide a semiconductor light emitting device having excellent optical characteristics.

Examples of the materials of the resin layer 25 and the insulating member 27 include, for example, a resin including mainly an epoxy resin, a resin including mainly a silicone resin, and a resin including mainly a fluorocarbon resin; and the desired characteristics can be obtained by adding materials in the resins recited above. For example, a sintered body (a ceramic) in which an inorganic substance is sintered may be used as the resin layer 25 and the insulating member 27. Thereby, the resin layer 25 includes a material that provides excellent light-shielding properties and excellent reinforcement of the device; and the insulating member 27 may include a material that has excellent light reflectance.

Therefore, the characteristics that are necessary for the mounting surface side and the characteristics that are necessary for the side surface side of the fluorescer layer 30 can be provided simultaneously. In other words, the suppression of the light leakage on the mounting surface side, the reinforcement of the device, and the suppression of the absorption loss on the side surface side of the fluorescer layer 30 can be performed simultaneously.

By the description recited above, the characteristics can be improved without increasing the constituent materials of the device. In other words, it is possible to provide a semiconductor light emitting device having excellent optical characteristics without enlarging the size of the device and without increasing the manufacturing processes of the device.

In addition to the description recited above, for example, the resin layer 25 is light-reflective similarly to the insulating member 27. In such a case, for example, the coefficient of thermal expansion of the resin layer 25 has a value that is smaller than the coefficient of thermal expansion of the insulating member 27 and equal to or near the coefficient of thermal expansion of the mounting substrate. The composition of the material included in the insulating member 27 is different from the composition of the material included in the resin layer 25.

Therefore, the resin layer 25 has characteristics that are excellent for light reflection and stress relief; and the insulating member 27 has characteristics that are superior to the resin layer 25 for light reflection. Thereby, the resin layer 25 and the insulating member 27 that have the necessary features can be provided in a minimum area. In other words, it is possible to provide a semiconductor light emitting device having excellent optical characteristics without enlarging the size of the device and without increasing the manufacturing processes of the device.

A method for manufacturing the semiconductor light emitting device of the embodiment will now be described with reference to FIG. 3A to FIG. 10B.

Figure 3A:
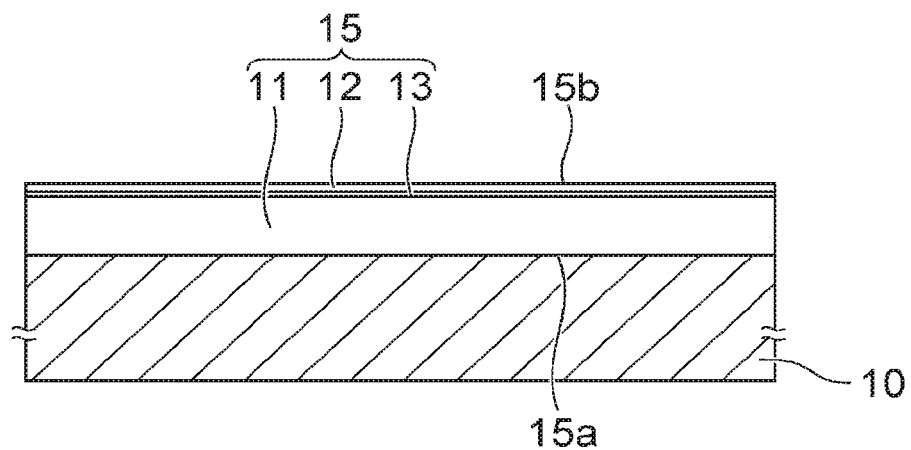
FIG. 3A to FIG. 10B are schematic views showing a method for manufacturing the semiconductor light emitting device of the embodiment.

As shown in FIG. 3A, for example, the first semiconductor layer 11, the light emitting layer 13, and the second semiconductor layer 12 are epitaxially grown in order on a major surface side of a substrate 10 by MOCVD (metal organic chemical vapor deposition).

In the semiconductor layer 15, the substrate 10 side is the first surface 15a; and the opposite side of the substrate 10 is the second surface 15b.

The substrate 10 is, for example, a silicon substrate. Or, the substrate 10 may be a sapphire substrate. The semiconductor layer 15 is, for example, a nitride semiconductor layer including gallium nitride (GaN).

The first semiconductor layer 11 includes, for example, a buffer layer that is provided on the major surface side of the substrate 10, and an n-type GaN layer that is provided on the buffer layer. The second semiconductor layer 12 includes, for example, a p-type AlGaN layer that is provided on the light emitting layer 13, and a p-type GaN layer that is provided on the p-type AlGaN layer. The light emitting layer 13 has, for example, a MQW (Multiple Quantum well) structure.

Figure 3B:
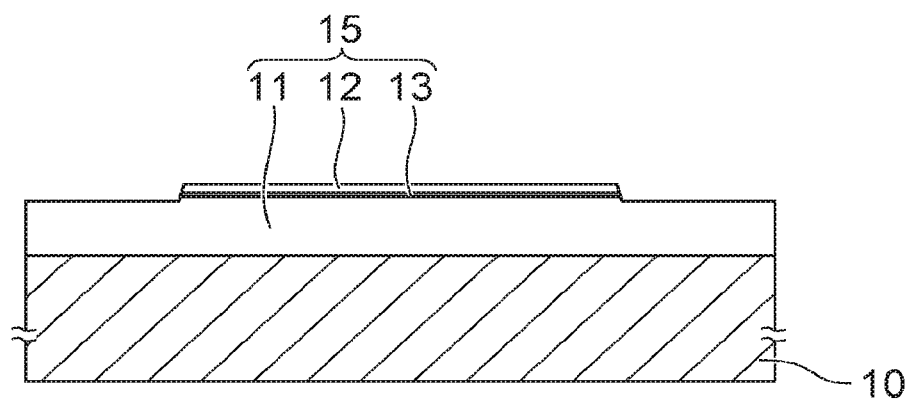

FIG. 3B shows the state in which the second semiconductor layer 12 and the light emitting layer 13 are selectively removed. For example, the first semiconductor layer 11 is exposed by selectively etching the second semiconductor layer 12 and the light emitting layer 13 by RIE (Reactive Ion Etching).

Figure 4A:
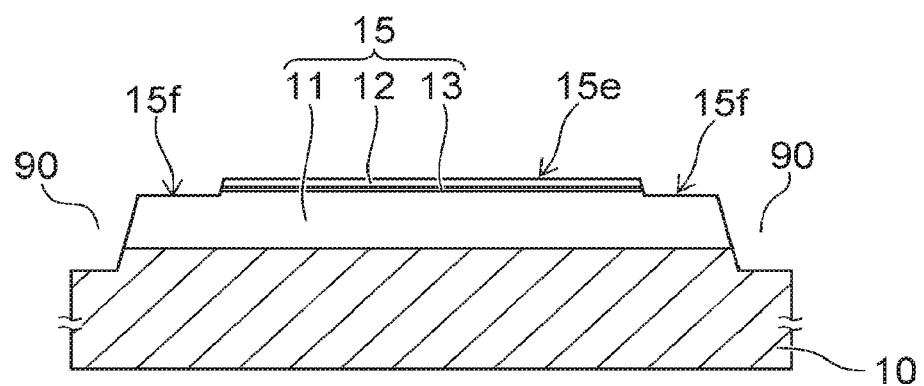

Then, as shown in FIG. 4A, a trench 90 is made by selectively removing the first semiconductor layer 11. The semiconductor layer 15 is divided into a plurality by the trench 90 on the major surface side of the substrate 10. For example, the trench 90 is made in a lattice pattern on the substrate 10 having a wafer configuration.

The trench 90 pierces the semiconductor layer 15 and reaches the substrate 10. By controlling the etching conditions such as the etching time, etc., at this time, the major surface of the substrate 10 also is etched slightly; and the bottom surface of the trench 90 is caused to recede to be lower than the interface between the substrate 10 and the semiconductor layer 15. The trench 90 may be made after the p-side electrode 16 and the n-side electrode 17 are formed.

Figure 4B:
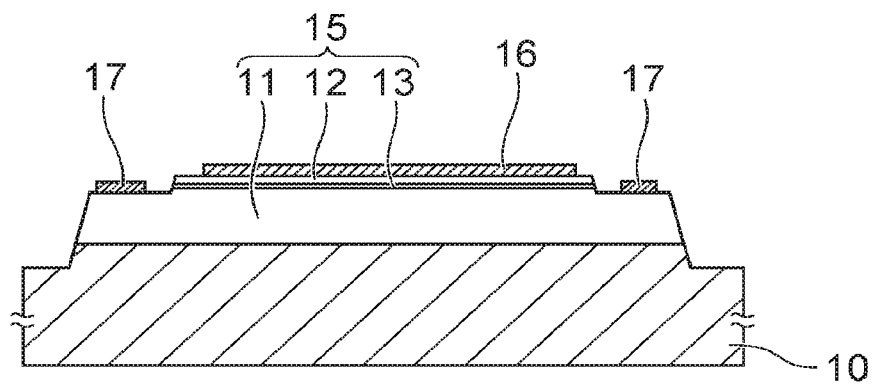

Then, as shown in FIG. 4B, the p-side electrode 16 is formed on the surface of the second semiconductor layer 12. The n-side electrode 17 is formed on the surface of the first semiconductor layer 11 in the region where the second semiconductor layer 12 and the light emitting layer 13 are selectively removed.

The p-side electrode 16 that is formed in the region where the light emitting layer 13 is stacked includes a reflective film that reflects the light radiated by the light emitting layer 13. For example, the p-side electrode 16 includes silver, a silver alloy, aluminum, an aluminum alloy, etc. Also, the p-side electrode 16 includes a metal protective film (a barrier metal) to prevent sulfidization and oxidization of the reflective film.

Figure 5A:
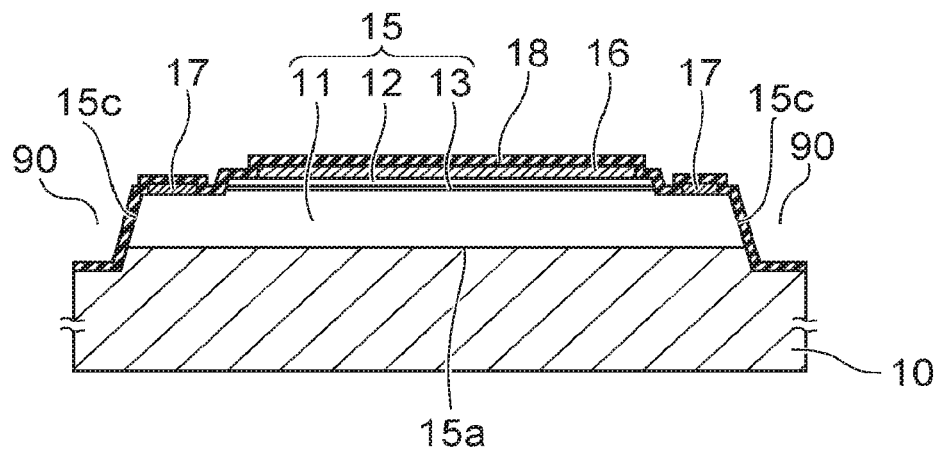

Then, as shown in FIG. 5A, the insulating film 18 is formed to cover the stacked body provided on the substrate 10. The insulating film 18 covers the second surface 15b of the semiconductor layer 15, the p-side electrode 16, and the n-side electrode 17. Also, the insulating film 18 covers the side surface 15c continuing from the first surface 15a of the semiconductor layer 15. The insulating film 18 is further formed on the surface of the substrate 10 at the bottom surface of the trench 90.

Figure 5B:
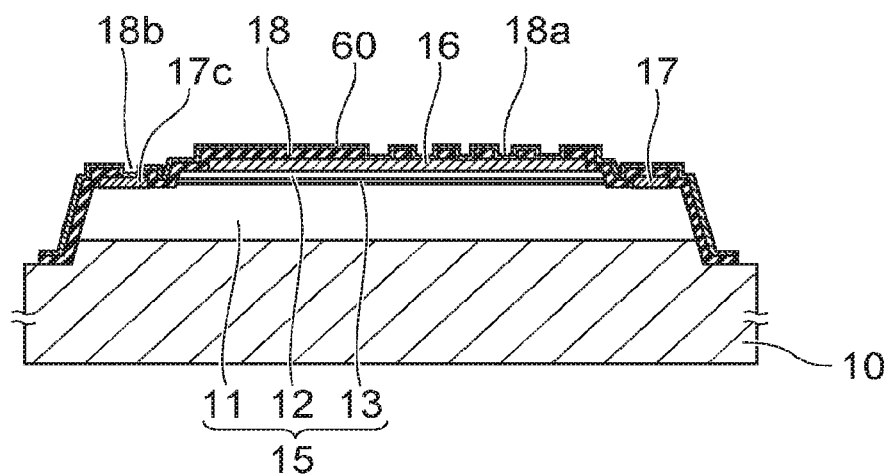

The insulating film 18 is, for example, a silicon oxide film or a silicon nitride film formed by CVD (Chemical Vapor Deposition). As shown in FIG. 5B, first openings 18a and a second opening 18b are made in the insulating film 18 by, for example, wet etching using a resist mask. The first openings 18a reach the p-side electrode 16; and the second opening 18b reaches the contact portion 17c of the n-side electrode 17. At this time, a portion of the insulating film 18 that is formed on the substrate 10 also is removed simultaneously.

Figure 6A:
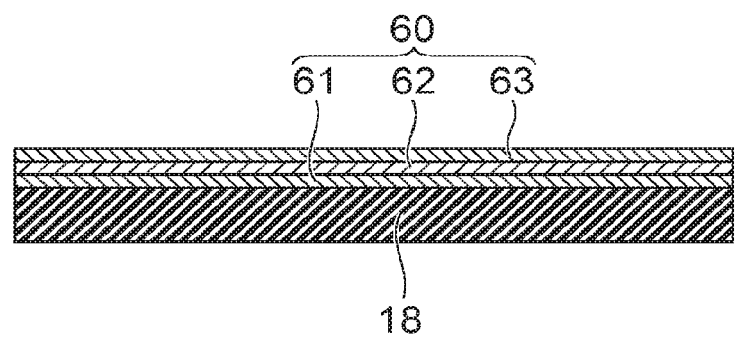

Then, as shown in FIG. 5B, a metal film 60 is formed on the surface of the insulating film 18, the inner walls (the side wall and the bottom surface) of the first openings 18a, and the inner walls (the side wall and the bottom surface) of the second opening 18b. As shown in FIG. 6A, the metal film 60 includes an aluminum film 61, a titanium film 62, and a copper film 63. For example, the metal film 60 is formed by sputtering.

Figure 6B:
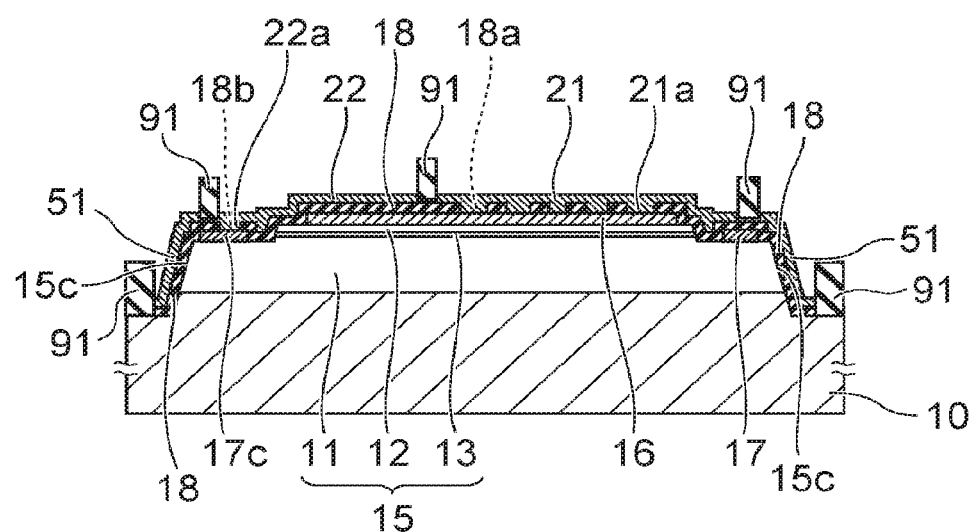

Continuing, after selectively forming a resist mask 91 shown in FIG. 6B on the metal film 60, the first p-side interconnect layer 21, the first n-side interconnect layer 22, and the reflective film 51 are formed by copper electroplating using the copper film 63 of the metal film 60 as a seed layer.

The first p-side interconnect layer 21 is formed also inside the first openings 18a and is electrically connected to the p-side electrode 16. The first n-side interconnect layer 22 is formed also inside the second opening 18b and is electrically connected to the contact portion 17c of the n-side electrode 17.

Figure 7A:
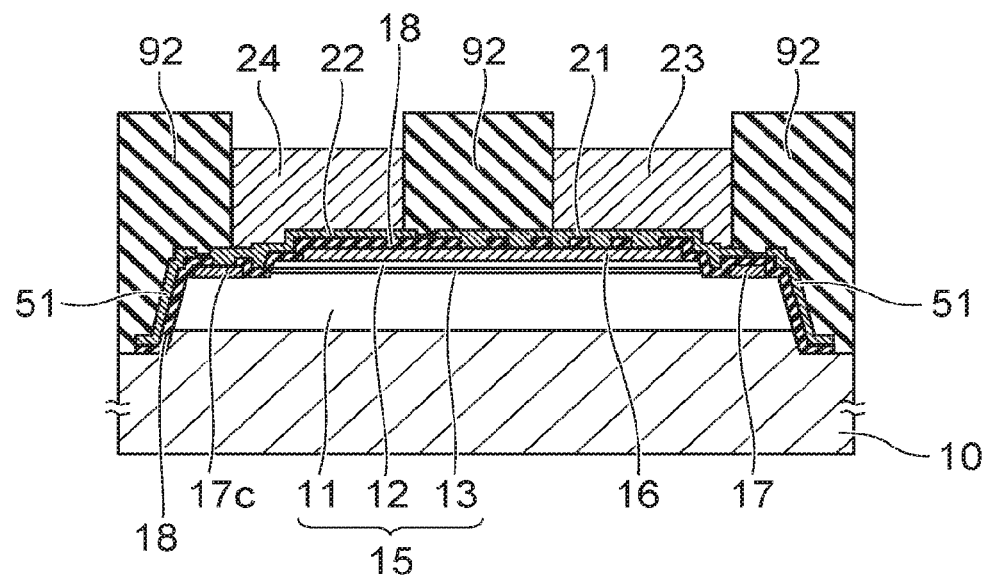

Then, after removing the resist mask 91 using, for example, a solvent or oxygen plasma, a resist mask 92 shown in FIG. 7A is formed selectively. Or, the resist mask 92 may be formed without removing the resist mask 91.

After forming the resist mask 92, the p-side pillar 23 and the n-side pillar 24 are formed by copper electroplating using the first p-side interconnect layer 21 and the first n-side interconnect layer 22 as a seed layer.

The p-side pillar 23 is formed on the first p-side interconnect layer 21. The first p-side interconnect layer 21 and the p-side pillar 23 are formed as one body made of the same copper material. The n-side pillar 24 is formed on the first n-side interconnect layer 22. The first n-side interconnect layer 22 and the n-side pillar 24 are formed as one body made of the same copper material.

The resist mask 92 is removed using, for example, a solvent or oxygen plasma. At this point in time, the first p-side interconnect layer 21 and the first n-side interconnect layer 22 are linked to each other via the metal film 60. Also, the first p-side interconnect layer 21 and the reflective film 51 are linked to each other via the metal film 60; and the first n-side interconnect layer 22 and the reflective film 51 are linked to each other via the metal film 60.

Therefore, the metal film 60 that is between the first p-side interconnect layer 21 and the first n-side interconnect layer 22, the metal film 60 that is between the first p-side interconnect layer 21 and the reflective film 51, and the metal film 60 that is between the first n-side interconnect layer 22 and the reflective film 51 are removed by etching.

Figure 7B:
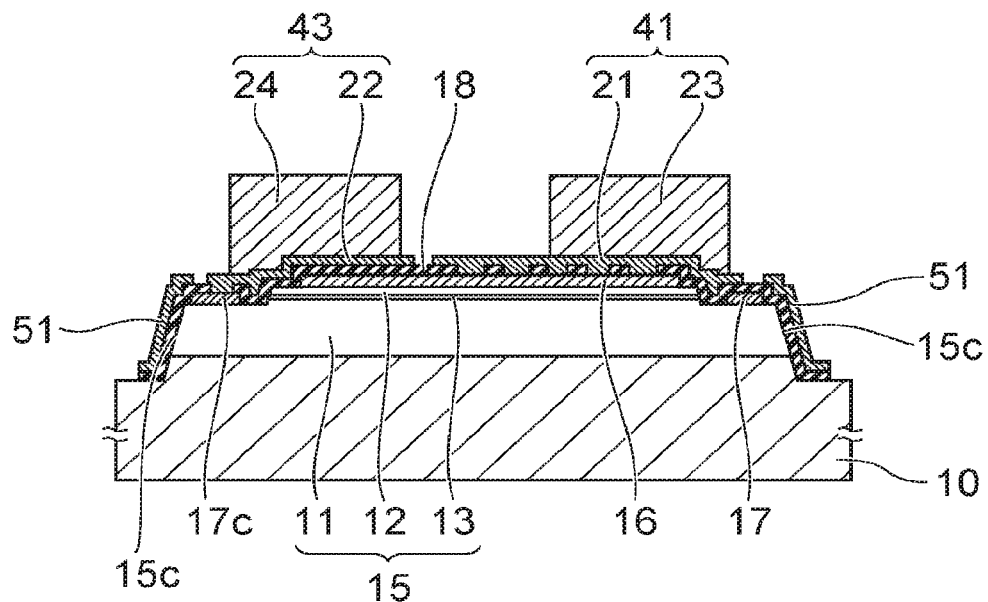

Thereby, the electrical connection via the metal film 60 between the first p-side interconnect layer 21 and the first n-side interconnect layer 22, the electrical connection via the metal film 60 between the first p-side interconnect layer 21 and the reflective film 51, and the electrical connection via the metal film 60 between the first n-side interconnect layer 22 and the reflective film 51 are broken (FIG. 7B).

Figure 8A:
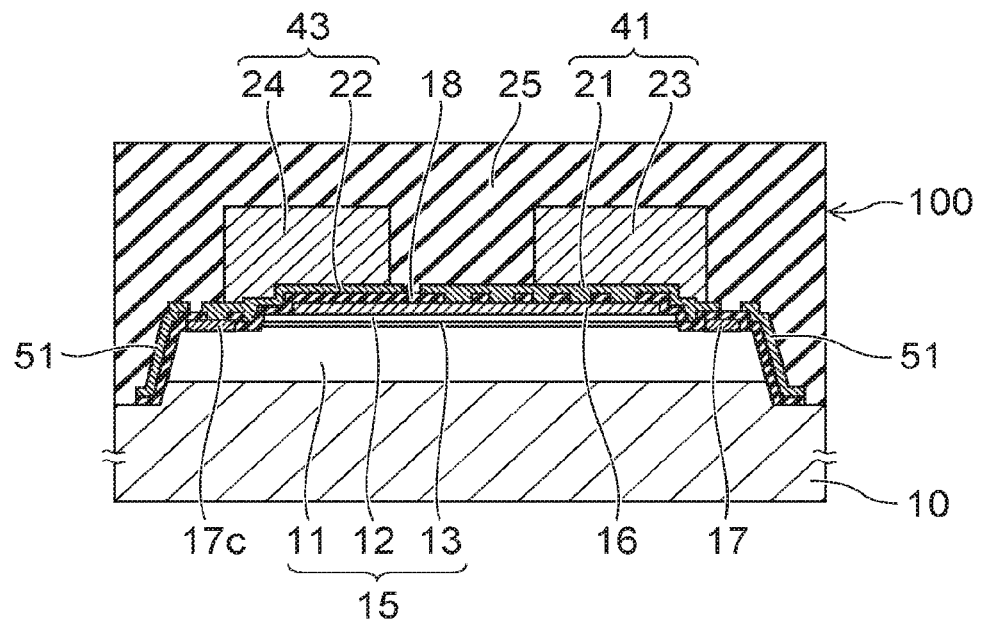
Figure 8B:
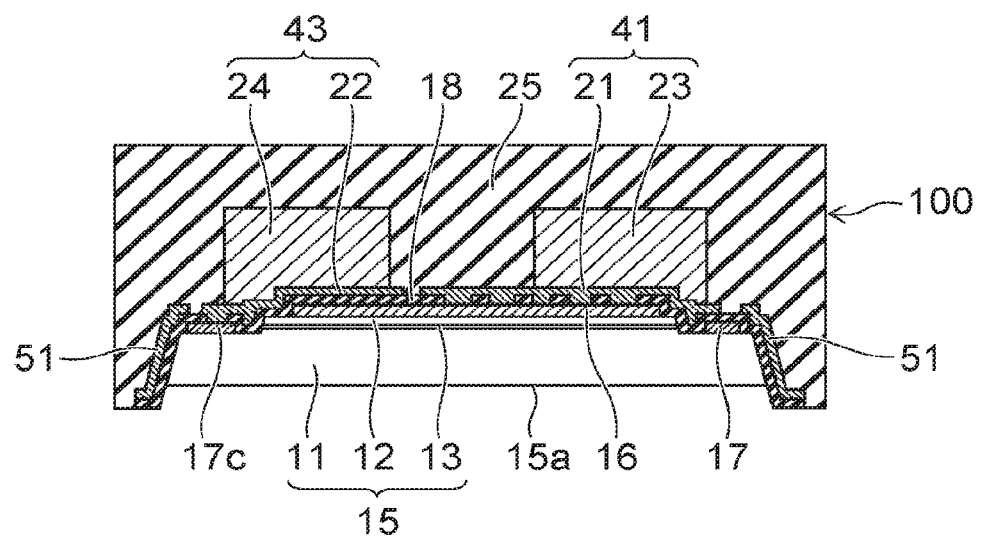

Then, the resin layer 25 shown in FIG. 8A is formed on the structure body shown in FIG. 7B. The resin layer 25 is formed on the side surface of the p-side electrode 16, the side surface of the p-side interconnect unit 41, the side surface of the n-side electrode 17, the side surface of the n-side interconnect unit 43, and the side surface of the semiconductor layer 15. The resin layer 25 covers the p-side interconnect unit 41 and the n-side interconnect unit 43. The resin layer 25 also covers the reflective film 51.

The resin layer 25 is included in the support body 100 with the p-side interconnect unit 41 and the n-side interconnect unit 43. The substrate 10 is removed in the state in which the semiconductor layer 15 is supported by the support body 100.

For example, the substrate 10 which is a silicon substrate is removed by dry etching such as RIE, etc. Or, the substrate 10 may be removed by wet etching. Or, in the case where the substrate 10 is a sapphire substrate, the substrate 10 can be removed by laser lift-off.

There are cases where the semiconductor layer 15 that is epitaxially grown on the substrate 10 has a large internal stress. The p-side pillar 23, the n-side pillar 24, and the resin layer 25 are materials that are more flexible than the semiconductor layer 15 that is made of, for example, a GaN-based material. Accordingly, even in the case where the internal stress in the epitaxial growth is released all at once when peeling the substrate 10, the stress is absorbed by the p-side pillar 23, the n-side pillar 24, and the resin layer 25. Therefore, damage of the semiconductor layer 15 in the process of removing the substrate 10 can be avoided.

The first surface 15a of the semiconductor layer 15 is exposed by the removal of the substrate 10. A micro unevenness is formed in the first surface 15a that is exposed by performing surface roughening (frosting). For example, wet etching of the first surface 15a is performed using a KOH (potassium hydroxide) aqueous solution, TMAH (tetramethyl ammonium hydroxide), etc. Different etching rates that are dependent on the crystal plane orientation occur in the etching. Therefore, the unevenness can be formed in the first surface 15a. The radiated light extraction efficiency of the light emitting layer 13 can be increased by forming the micro unevenness in the first surface 15a.

Figure 9A:
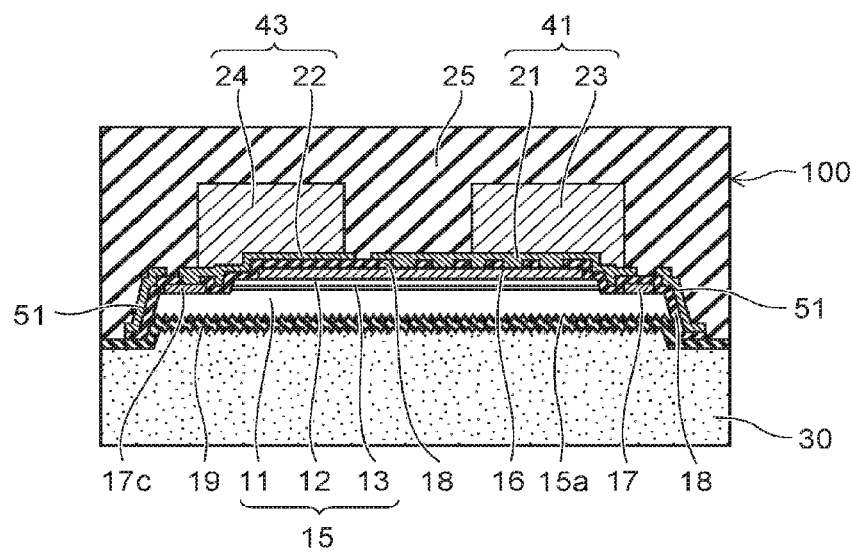

As shown in FIG. 9A, the fluorescer layer 30 is formed on the first surface 15a with the insulating layer 19 interposed. The fluorescer layer 30 is formed on the semiconductor layer 15 and on the resin layer 25. For example, the fluorescer layer 30 is formed by a method such as printing, potting, molding, compression molding, etc. The insulating layer 19 increases the adhesion between the semiconductor layer 15 and the fluorescer layer 30.

As the fluorescer layer 30, a cured fluorescer that is made of the fluorescers 31 dispersed in the binder 32 may be used.

The fluorescer layer 30 also is formed on the resin layer 25 provided in the region around the side surface 15c of the semiconductor layer 15. The fluorescer layer 30 is formed on the resin layer 25 with the insulating layer 19 interposed. After forming the fluorescer layer 30, the surface of the resin layer 25 is polished. Thereby, the lower surface of the p-side pillar 23 and the lower surface of the n-side pillar 24 are exposed from the resin layer 25.

Then, the structure body is cut in the region (the dicing region) where the trench 90 described above is made to divide the multiple semiconductor layers 15. In other words, the fluorescer layer 30, the insulating layer 19, and the resin layer 25 are cut. The semiconductor layer 15 is not damaged by the dicing because the dicing region does not exist.

The processes described above prior to the singulation are performed in the wafer state that includes the multiple semiconductor layers 15. The wafer is singulated into semiconductor light emitting devices including at least one semiconductor layer 15 each. The semiconductor light emitting device may have a single-chip structure including one semiconductor layer 15; or a multi-chip structure including multiple semiconductor layers 15 may be used.

Figure 9B:
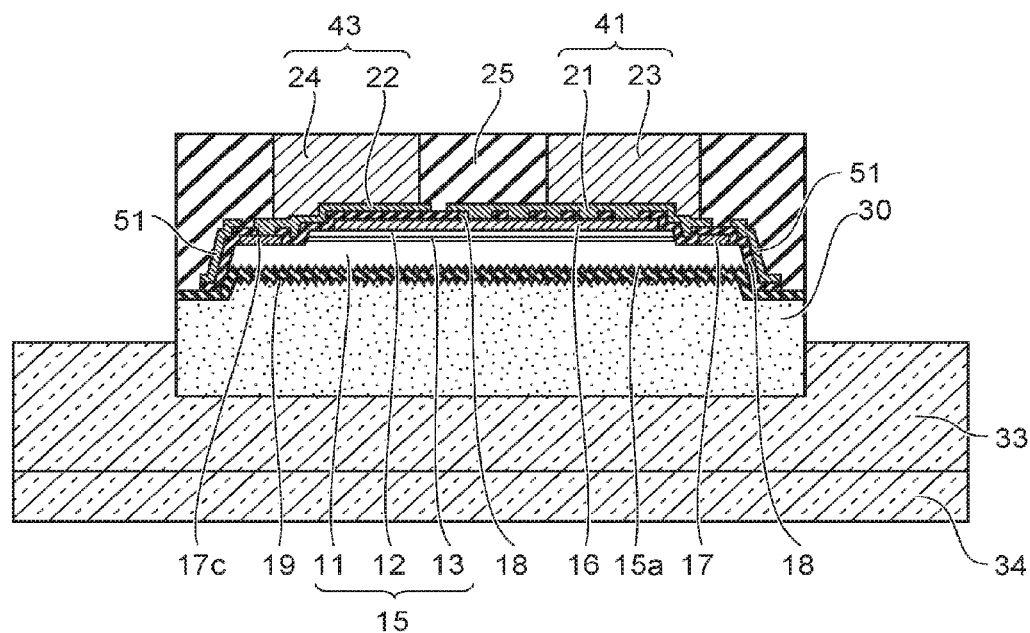

As shown in FIG. 9B, the surface of the fluorescer layer 30 (the major surface separated from the insulating layer 19) of the singulated chip is bonded (pressed) onto the transparent layer 33 supported by the substrate 34. The depth that the fluorescer layer 30 is buried in the transparent layer 33 is arbitrary.

Figure 10A:
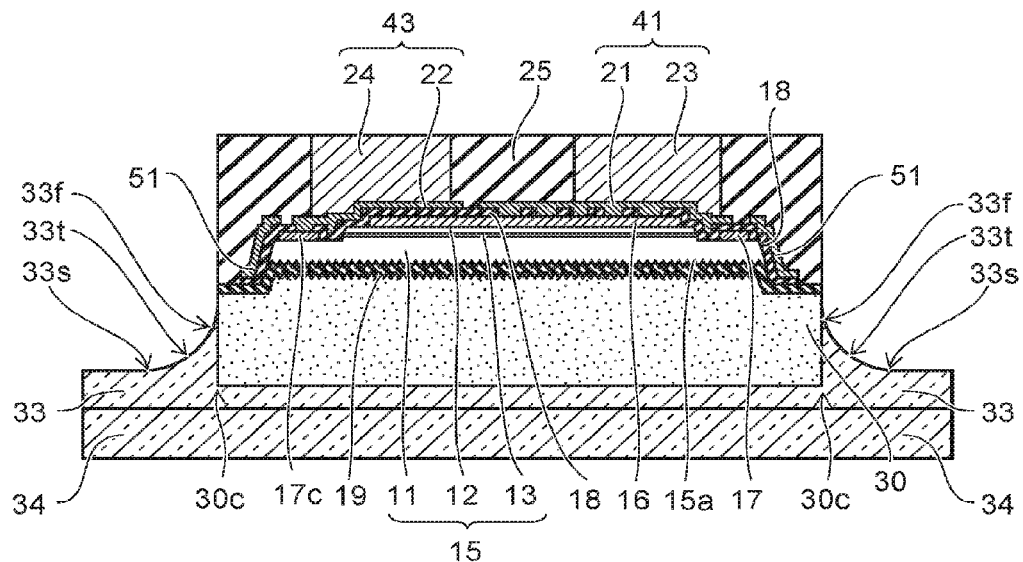

As shown in FIG. 10A, the fluorescer layer 30 pushes back from the transparent layer 33 (a sway back phenomenon). For example, the fluorescer layer 30 is push backed by the repulsion force of the transparent layer 33 that was pressed in the bonding. Also, for example, a force may be applied to pull back the transparent layer 33 in the upward direction.

At this time, the surface of the fluorescer layer 30 and a portion of the side surface of the fluorescer layer 30 are maintained in a state of contacting the transparent layer 33. The transparent layer 33 contacts the front surface, side surface, and corner 30c of the fluorescer layer 30.

The first lower end portion 33f that contacts the side surface of the fluorescer layer 30 is formed on the surface (the major surface on the side including the portion contacting the fluorescer layer 30) of the transparent layer 33; and the second lower end portion 33s that is separated from the fluorescer layer 30 is formed. The thickness of the transparent layer 33 at the first lower end portion 33f is thicker than the thickness of the transparent layer 33 at the second lower end portion 33s. The height of the second lower end portion 33s is between the height of the corner 30c of the fluorescer layer 30 and the height of the first lower end portion 33f and may be, for example, equal to the height of the first lower end portion 33f. Here, "thickness" and "height" refer to the thickness and the height in the direction from the semiconductor layer 15 toward the fluorescer layer 30.

The tilted portion 33t that is tilted with respect to the side surface of the fluorescer layer 30 is formed on the surface of the transparent layer 33. The tilted portion 33t is formed continuously from the first lower end portion 33f to the second lower end portion 33s. The tilted portion 33t approaches the height of the surface of the fluorescer layer 30 away from the side surface of the fluorescer layer 30. For example, the tilted portion 33t has a curved surface having a recessed configuration.

By forming the corner 30c of the fluorescer layer 30, it is easy to extract light at even wide angles; and it is possible to increase the light extraction efficiency. Because the corner 30c of the fluorescer layer 30 is pressed into the transparent layer 33, the bonding strength of both is increased. Thereby, it is possible to suppress the peeling of the transparent layer 33. By utilizing this configuration, it is also possible to control the orientation of the light emitted from the fluorescer layer 30.

Figure 10B:
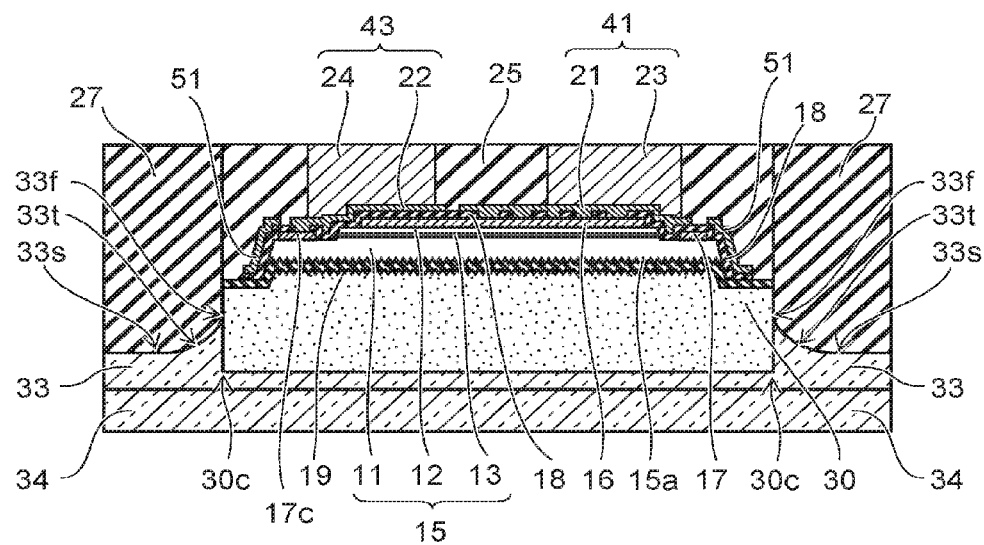

As shown in FIG. 10B, the insulating member 27 is formed as one body on the surface of the transparent layer 33, the side surface of the fluorescer layer 30, and the side surface of the resin layer 25. The insulating member 27 contacts the side surface of the fluorescer layer 30 and the first lower end portion 33f, the tilted portion 33t, and the second lower end portion 33s of the transparent layer 33. The surface of the insulating member 27 that contacts the transparent layer 33 is formed at a height that is more proximal to the semiconductor layer 15 than is the height of the surface of the fluorescer layer 30. Also, the surface of the insulating member 27 that contacts the transparent layer 33 approaches the height of the surface of the fluorescer layer 30 away from the side surface of the fluorescer layer 30.

Thereby, a stepped portion is formed between the surface of the fluorescer layer 30 and the surface of the insulating member 27 contacting the transparent layer 33.

The exposed surface (the surface opposing the surface contacting the transparent layer 33) of the insulating member 27 is in the same plane as, for example, the exposed surface of the p-side pillar 23 and the exposed surface of the n-side pillar 24 and is exposed from, for example, the resin layer 25. Here, "exposed surface" refers to the surface provided on the page surface upper side of FIG. 10B.

Subsequently, as shown in FIG. 1, the p-side interconnect 71 is formed on the exposed surface of the p-side pillar 23, the exposed surface of the resin layer 25, and the exposed surface of the insulating member 27. The p-side interconnect 71 is formed as one body overlapping the p-side pillar 23, the resin layer 25, the semiconductor layer 15, and the insulating member 27. The p-side interconnect 71 is electrically connected to the p-side pillar 23 and extends across the resin layer 25 and the insulating member 27 onto the insulating member 27.

The n-side interconnect 72 is formed on the exposed surface of the n-side pillar 24, the exposed surface of the resin layer 25, and the exposed surface of the insulating member 27. The n-side interconnect 72 is formed as one body overlapping the n-side pillar 24, the resin layer 25, the semiconductor layer 15, and the insulating member 27. The n-side interconnect 72 is electrically connected to the n-side pillar 24 and extends across the resin layer and the insulating member 27 across onto the insulating member 27.

The exposed surface of the n-side pillar 24 is formed to have a surface area that is greater than the n-side electrode 17. Therefore, even in the case where the formation position of the n-side interconnect 72 is shifted somewhat with respect to the chip, the n-side interconnect 72 can overlap and be connected to the n-side pillar 24 reliably.

The insulating film 78 is formed on the surface of the p-side interconnect 71 and the surface of the n-side interconnect 72. The insulating film 78 is formed also at the peripheries of the interconnects 71 and 72. Thereby, the semiconductor light emitting device of the embodiment is formed.

According to the embodiment, the transparent layer 33 is formed in contact with the corner 30c and side surface of the fluorescer layer 30. Thereby, the light that travels via the corner 30c vicinity can be easily emitted to the outside; and the light extraction efficiency to the outside can be increased. In other words, it is possible to provide a semiconductor light emitting device having excellent optical characteristics.

The transparent layer 33 includes the first lower end portion 33f, the second lower end portion 33s, and the tilted portion 33t. The tilted portion 33t is tilted with respect to the side surface of the fluorescer layer 30. In such a case, the upper surface of the insulating member 27 is formed to approach the height of the corner 30c of the fluorescer layer 30 away from the side surface of the fluorescer layer 30. Thereby, the light that travels via the tilted portion 33t is easily reflected in the upper surface direction of the fluorescer layer 30. Therefore, the light extraction efficiency to the outside can be increased. In other words, it is possible to provide a semiconductor light emitting device having excellent optical characteristics.

The tilted portion 33t has a curved surface. Thereby, the directions in which the light is reflected can be dispersed. In other words, it is possible to provide a semiconductor light emitting device having excellent optical characteristics.

Because the corner 30c of the fluorescer layer 30 is pressed into the transparent layer 33, the bonding strength of both is higher. Thereby, it is possible to suppress the peeling of the transparent layer 33.

In addition to the description recited above, according to the embodiment, because the processes described above prior to the singulation can be performed collectively in the wafer state, it is unnecessary to perform the formation of the interconnect layers, the formation of the pillars, the packaging with the resin layer, and the formation of the fluorescer layer for every singulated individual device; and a drastic cost reduction is possible.

Because the support body 100 and the fluorescer layer 30 are cut after being formed in the wafer state, the side surface of the fluorescer layer 30 is aligned with the side surface of the support body 100 (the side surface of the resin layer 25); therefore, the insulating member 27 can be formed easily. Also, because the lower surfaces of the metal pillars 23 and 24 are aligned with the lower surface of the resin layer 25, the interconnects 71 and 72 can be formed easily.

An example of the configuration of a semiconductor light emitting device of another embodiment will now be described with reference to FIG. 12.

In the embodiment, the main difference from the embodiment described above is the configuration of the interconnect periphery. Therefore, a description is partially omitted for portions similar to those of the embodiment described above.

Figure 12:
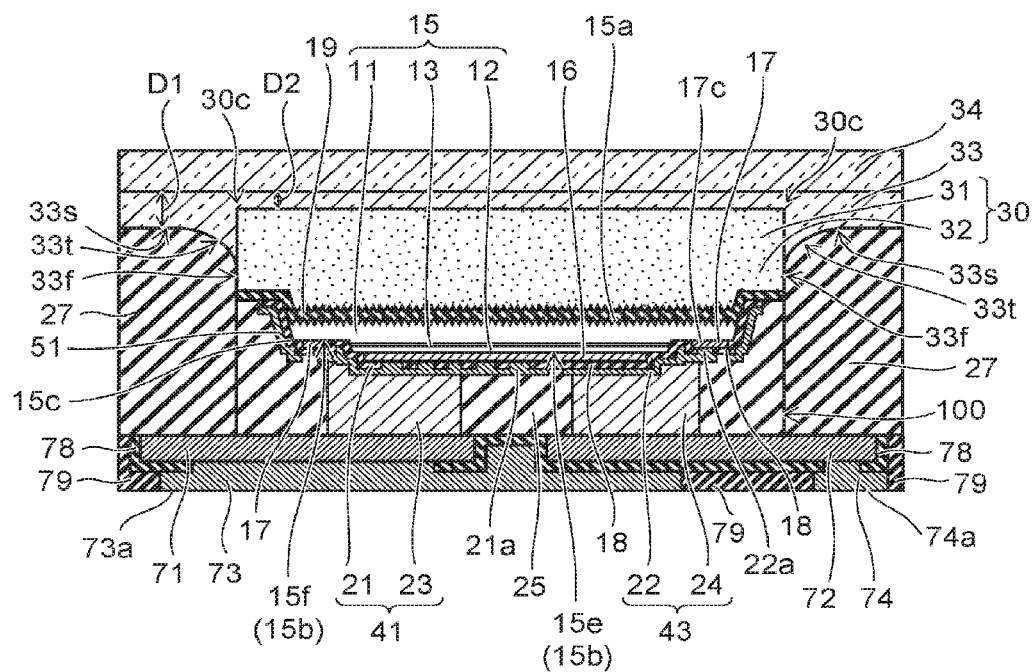
FIG. 12 is a schematic cross-sectional view of the semiconductor light emitting device of another embodiment.

As shown in FIG. 12, a p-side external connection electrode 73 is connected to the p-side interconnect 71. An n-side external connection electrode 74 is connected to the n-side interconnect 72. The planar size of the p-side external connection electrode 73 is larger than the planar size of the p-side interconnect 71. The planar size of the n-side external connection electrode 74 is smaller than the planar size of the n-side interconnect 72 and smaller than the planar size of the p-side external connection electrode 73.

A resin layer 79 is provided between the p-side external connection electrode 73 and the n-side external connection electrode 74. The resin layer 79 contacts the side surface of the p-side external connection electrode 73 and the side surface of the n-side external connection electrode 74 and is filled between the p-side external connection electrode 73 and the n-side external connection electrode 74. The resin layer 79 is provided also at the periphery of the p-side external connection electrode 73 and the periphery of the n-side external connection electrode 74.

The lower surfaces of the external connection electrodes 73 and 74 are exposed from the resin layer 79 and function as a p-side mounting surface 73b and an n-side mounting surface 74b that are connectable to an external circuit such as a mounting substrate, etc. For example, the mounting surfaces 73b and 74b are bonded to the land pattern of the mounting substrate by solder or a conductive bonding agent.

The surface area of the p-side mounting surface 73b is greater than the surface area of the mounting surface 71a. The surface area of the n-side mounting surface 74b of the p-side interconnect 71 is less than the surface area of the mounting surface 72a of the n-side interconnect 72 and less than the surface area of the p-side mounting surface 73b. The spacing between the p-side mounting surface 73b and the n-side mounting surface 74b is set to a spacing such that the solder does not bridge between the mounting surfaces 73b and 74b when mounting.

According to the embodiment, similarly to the embodiment described above, the transparent layer 33 contacts the upper surface, the corner 30c, and the side surface of the fluorescer layer 30. Thereby, it is possible to provide a semiconductor light emitting device having excellent optical characteristics.

In addition to the description recited above, according to the embodiment, second pillars 73s and 74s are connected respectively to the interconnects 71 and 72. For example, the external connection electrodes 73 and 74 may be connected respectively to the interconnects 71 and 72. Thereby, it is possible to arbitrarily set the planar layout for mounting.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
 a semiconductor layer including a first semiconductor layer, a second semiconductor layer, a light emitting layer, a first surface, and a second surface, the light emitting layer provided between the first semiconductor layer and the second semiconductor layer, the second surface opposing the first surface;
 a p-side electrode contacting the second semiconductor layer;
 an n-side electrode contacting the first semiconductor layer;
 a p-side pillar provided on the second surface side, the p-side pillar contacting the p-side electrode;
 an n-side pillar provided on the second surface side, the n-side pillar contacting the n-side electrode;
 a first insulating layer provided on an outer side of a side surface of the semiconductor layer;
 an optical layer provided on the first surface of the first semiconductor layer and on the first insulating layer;
 a second insulating layer provided on an outer side of a side surface of the first insulating layer and on an outer side of a side surface of the optical layer;
 a first layer provided on the second insulating layer and on the optical layer, the first layer contacting an upper surface, a side surface, and a corner of the optical layer, the first layer being light-transmissive and including
  a first lower end portion contacting the side surface of the optical layer and the upper surface of the second insulating layer, and
  a second lower end portion separated from the optical layer and provided at a height lower than a height of the corner of the optical layer and not less than a height of the first lower end portion, the second lower end portion contacting the upper surface of the second insulating layer;
 a p-side interconnect contacting the p-side pillar and extending in a region overlapping the first insulating layer and the second insulating layer; and
 an n-side interconnect separated from the p-side interconnect, the n-side interconnect contacting the n-side pillar and extending in a region overlapping the first insulating layer and the second insulating layer.

2. The device according to claim 1, wherein a distance from the second lower end portion to an upper surface of the first layer is greater than a distance from the upper surface of the optical layer to the upper surface of the first layer.

3. The device according to claim 1, wherein
the first layer includes a tilted portion tilted with respect to the side surface of the optical layer, and
the tilted portion is provided to be continuous from the first lower end portion to the second lower end portion.

4. The device according to claim 3, wherein the tilted portion of the first layer has a curved surface.

5. The device according to claim 4, wherein the curved surface has a recessed configuration.

6. The device according to claim 3, wherein the first lower end portion protrudes further toward the second insulating layer than does the second lower end portion.

7. The device according to claim 1, further comprising a second layer provided on the first layer, the second layer being light-transmissive.

8. The device according to claim 1, wherein the first lower end portion is provided at a height between the height of the corner and a height of an upper surface of the first insulating layer.

9. The device according to claim 1, wherein the first insulating layer includes a material different from the second insulating layer.

10. The device according to claim 1, further comprising an insulating film provided on a side surface of the p-side interconnect and a side surface of the n-side interconnect.

11. A semiconductor light emitting device, comprising:
a semiconductor layer including a first semiconductor layer, a second semiconductor layer, a light emitting layer, a first surface, and a second surface, the light emitting layer provided between the first semiconductor layer and the second semiconductor layer, the second surface opposing the first surface;
a p-side electrode contacting the second semiconductor layer;
an n-side electrode contacting the first semiconductor layer;
a p-side pillar provided on the second surface side, the p-side pillar contacting the p-side electrode;
an n-side pillar provided on the second surface side, the n-side pillar contacting the n-side electrode;
a first insulating layer provided on an outer side of a side surface of the semiconductor layer;
an optical layer provided on the first surface of the semiconductor layer and on the first insulating layer;
a second insulating layer provided on an outer side of a side surface of the first insulating layer and on an outer side of a side surface of the optical layer, the second insulating layer having an upper surface provided at a height more proximal to the semiconductor layer than a height of an upper surface of the optical layer, a portion of the upper surface being tilted with respect to the side surface of the optical layer and approaching the height of the upper surface of the optical layer away from the side surface of the optical layer;
a p-side interconnect contacting the p-side pillar and extending in a region overlapping the first insulating layer and the second insulating layer; and
an n-side interconnect contacting the n-side pillar, extending in a region overlapping the first insulating layer and the second insulating layer, and being separated from the p-side interconnect.

12. The device according to claim 11, wherein the tilt of the upper surface of the second insulating layer has a curved surface.

13. The device according to claim 12, wherein the curved surface has a protruding configuration.

14. The device according to claim 11, further comprising a first layer provided on the second insulating layer and on the optical layer, the first layer being light-transmissive and contacting an upper surface, a side surface, and a corner of the optical layer.

15. The device according to claim 14, further comprising a second layer provided on the first layer, the second layer being light-transmissive.

16. The device according to claim 11, wherein the upper surface of the second insulating layer is provided at a height between the height of the upper surface of the optical layer and a height of an upper surface of the first insulating layer.

17. The device according to claim 11, wherein the optical layer includes a stepped portion provided between the second insulating layer and the upper surface of the optical layer.

18. The device according to claim 11, wherein the first insulating layer includes a material different from the second insulating layer.

19. The device according to claim 11, further comprising an insulating film provided on a side surface of the p-side interconnect and a side surface of the n-side interconnect.

20. A method for manufacturing a semiconductor light emitting device, comprising:
forming a semiconductor layer, the semiconductor layer including a first semiconductor layer, a second semiconductor layer, and a light emitting layer provided between the first semiconductor layer and the second semiconductor layer;
forming a p-side electrode and an n-side electrode contacting the semiconductor layer;
forming a p-side pillar electrically connected to the p-side electrode;
forming an n-side pillar electrically connected to the n-side electrode and separated from the p-side pillar with the first insulating layer interposed between the n-side pillar and the p-side pillar;
forming a first insulating layer on a side surface of the p-side electrode, on a side surface of the n-side electrode, and on a side surface of the semiconductor layer;
forming an optical layer on the semiconductor layer and on the first insulating layer;
bonding a surface of the optical layer to a first layer, and forming a tilted portion in a surface of the first layer, the first layer being light-transmissive, the tilted portion contacting a side surface of the optical layer and being tilted with respect to the side surface of the optical layer;
forming a second insulating layer contacting the tilted portion, the side surface of the optical layer, and a side surface of the first insulating layer;
forming a p-side interconnect as one body overlapping the first insulating layer, the second insulating layer, and the p-side pillar, the p-side interconnect electrically connected to the p-side pillar; and
forming an n-side interconnect as one body overlapping the first insulating layer, the second insulating layer, and the n-side pillar, the n-side interconnect electrically connected to the n-side pillar.

* * * * *